(12) United States Patent
Kim

(10) Patent No.: US 10,147,481 B2
(45) Date of Patent: Dec. 4, 2018

(54) CLEAN DATA STROBE SIGNAL GENERATING CIRCUIT IN READ INTERFACE DEVICE

(71) Applicant: Samsung Electronics Co., Ltd., Suwon-si, Gyeonggi-do (KR)

(72) Inventor: Daero Kim, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 84 days.

(21) Appl. No.: 15/292,834

(22) Filed: Oct. 13, 2016

(65) Prior Publication Data

US 2017/0110175 A1 Apr. 20, 2017

(30) Foreign Application Priority Data

Oct. 16, 2015 (KR) .................. 10-2015-0144835

(51) Int. Cl.
*G11C 11/4093* (2006.01)
*G11C 11/4076* (2006.01)
*G11C 11/4096* (2006.01)
*G06F 13/16* (2006.01)

(52) U.S. Cl.
CPC ...... *G11C 11/4093* (2013.01); *G06F 13/1689* (2013.01); *G11C 11/4076* (2013.01); *G11C 11/4096* (2013.01); *G11C 2207/2272* (2013.01); *H05K 999/99* (2013.01)

(58) Field of Classification Search
CPC ............ G11C 11/4093; G11C 11/4076; G11C 11/4096
USPC ..................................... 365/189.05
See application file for complete search history.

(56) References Cited

U.S. PATENT DOCUMENTS

| | | | |
|---|---|---|---|
| 6,715,096 B2 | 3/2004 | Kuge | |
| 7,002,378 B2 | 2/2006 | Srikanth et al. | |
| 7,450,441 B2 | 11/2008 | Lee | |
| 7,457,175 B1* | 11/2008 | Griffith | G06F 13/1689 365/193 |
| 7,590,025 B2* | 9/2009 | Wang | G11C 7/1078 365/193 |
| 7,676,684 B2 | 3/2010 | Ando | |
| 7,826,281 B2 | 11/2010 | Nakashima | |
| 8,477,543 B2 | 7/2013 | Kwon | |
| 8,504,788 B2 | 8/2013 | Stott et al. | |
| 8,630,131 B1* | 1/2014 | Shiao | G11C 5/04 326/30 |

(Continued)

OTHER PUBLICATIONS

Patel, Nor as Universal Gate, Instructables, Jul. 10, 2012.*

*Primary Examiner* — T Bui
*Assistant Examiner* — Alfredo Bermudez Lozada
(74) *Attorney, Agent, or Firm* — Harness, Dickey & Pierce, P.L.C.

(57) ABSTRACT

A clean data strobe signal generating circuit in a read interface device includes receivers configured to output first and second single ended data strobe signals. In the circuit, a gate signal generating unit is configured to generate a data strobe gate signal synchronized with the first single ended data strobe signal using the first and second single ended data strobe signals and a memory gate signal of which the pulse width varies in accordance with a burst length after termination of a read latency. The gating unit is configured to generate a clean data strobe signal using the first single ended data strobe signal and the data strobe gate signal.

18 Claims, 13 Drawing Sheets

(56) References Cited

U.S. PATENT DOCUMENTS

| | | | |
|---|---|---|---|
| 2013/0294176 A1* | 11/2013 | Nishio | G11C 8/18 365/189.05 |
| 2013/0297961 A1 | 11/2013 | Zhu et al. | |
| 2014/0359207 A1 | 12/2014 | Zhu et al. | |
| 2015/0340072 A1* | 11/2015 | Mazumder | G11C 7/222 365/189.05 |
| 2015/0364171 A1* | 12/2015 | Hollis | G11C 11/4093 365/193 |

* cited by examiner

CLEAN DATA STROBE SIGNAL GENERATING CIRCUIT IN READ INTERFACE DEVICE

CROSS-REFERENCE TO RELATED APPLICATION

A claim for the benefit of priority under 35 U. S. C. § 119 is made to Korean Patent Application No. 10-2015-0144835, filed Oct. 16, 2015 in the Korean Intellectual Property Office (KIPO), the entire contents of which are hereby incorporated by reference.

BACKGROUND

The inventive concepts described herein relate to a memory system, and more particularly, to an interface device which interfaces information between a semiconductor memory device and a memory controller.

The need for low-power and high-density memories are increasing to improve the performance of electronic systems.

For implementation of the low-power and high-density memories, a high bandwidth memory is receiving attention to provide high performance in situations such as low-power high-speed operation.

An LPDDR (Low Power Double Data Rate) type of Dynamic Random Access Memory (DRAM) mounted in a mobile device is a semiconductor memory device that operates at a low-power double data rate. The semiconductor memory device can be controlled by a memory controller communicating with a processor or System on Chip (SoC). In read operation mode, the memory controller receives read data using a data strobe signal.

When a ground termination type of on-die termination operation is performed in a differential receiver of an interface device and a data strobe signal is not provided from a semiconductor memory device, a dirty signal of tri-state condition may be outputted from the differential receiver.

SUMMARY

Various example embodiments of the inventive concepts provide a clean data strobe signal generating circuit in a read interface device, which can generate a clean data strobe signal without a delay control circuit or without performing a training operation.

Various example embodiments of the inventive concepts also provide a clean data strobe signal generating circuit in a read interface device, which can generate a clean data strobe signal by masking a data strobe signal, generated in asynchronization with an internal clock of an interface device, without gate signal training.

One aspect of some example embodiments of the inventive concepts is directed to provide a clean data strobe signal generating circuit in a read interface device. The clean data strobe signal generating circuit may include a first receiver configured to receive a differential data strobe signal comprising at least a first input data strobe signal and a second input data strobe signal, and output a first single ended data strobe signal, a second receiver configured to receive the second input data strobe signal and a reference voltage signal, and based on the received second input data strobe signal and the reference voltage signal, output a second single ended data strobe signal, a gate signal generator configured to generate a data strobe gate signal synchronized with the first single ended data strobe signal based on the first and second single ended data strobe signals and a memory gate signal, the memory gate signal including a pulse width that varies in accordance with a burst length after termination of a read latency, at least one logic gate configured to receive the first single ended data strobe signal and the data strobe gate signal to generate a clean data strobe signal for receiving read data.

The differential data strobe signal may be transmitted from a semiconductor memory device.

The phase of the second single ended data strobe signal may be opposite to the phase of the first single ended data strobe signal except in an unknown section of the first single ended data strobe signal.

The data strobe gate signal may transition to a first level in response to a signal synchronized with the second single ended data strobe signal, the number of toggles of the first single ended data strobe signal may be counted in response to a count start signal synchronized with a first falling edge of the first single ended data strobe signal, and the data strobe gate signal may transition to a second level in response to a reset signal generated after the counting of the number of toggles.

When the first single ended data strobe signal is inverted by an inverter, the at least one logic gate may be a NOR gate that generates a NOR response as the gating response.

The differential data strobe signal may be applied from an LPDDR4 DRAM device configured to perform a ground voltage termination type of on-die termination operation.

The clean data strobe signal may be provided as a data clock signal of a First-In First-Out (FIFO) memory device configured to receive the read data.

The pulse width of the memory gate signal may be half the pulse width of the burst length.

A pulse window of the data strobe gate signal when an extra toggling exists in the first single ended data strobe signal may become narrower than a pulse window of the data strobe gate signal when the extra toggling does not exist.

Another aspect of some example embodiments of the inventive concepts is directed to provide a clean data strobe signal generating circuit in a read interface device. The clean data strobe signal generating circuit may include a first receiver configured to receive a differential data strobe signal comprising first and second input data strobe signals, and output a first single ended data strobe signal, a second receiver configured to receive the second input data strobe signal and a reference signal, and based on the received second input data strobe signal and the reference signal, output a second single ended data strobe signal, a memory gate signal generator configured to generate a memory gate signal having a pulse width to which a burst length is applied after termination of a read latency, a gate signal generator configured to receive the first and second single ended data strobe signals and the memory gate signal, and generate a data strobe gate signal by counting a number of toggles of the first single ended data strobe signal based on the memory gate signal, and at least one logic gate configured to receive the first single ended data strobe signal and the data strobe gate signal, and generate a clean data strobe signal for receiving read data, as a gating response.

The differential data strobe signal may be transmitted from a DRAM transmitting/receiving data and control signals through a plurality of lines.

The counting of the number of toggles of the first single ended data strobe signal may be performed by a counter or a shift register.

Still another aspect of some example embodiments of the inventive concepts is directed to an interface device which includes an input buffer configured to receive read data transmitted from a semiconductor memory device, a data receiving memory configured to store read data outputted from the input buffer in response to a data clock, and output the stored read data to a data receiving device, and a clean data strobe signal generating circuit configured to generate a clean data strobe signal as the data clock based on a memory gate signal having a pulse width, a burst length being applied to the memory gate signal after the termination of a read latency, and a differential data strobe signal transmitted from the semiconductor memory device.

The data receiving memory may be a First-In First-Out (FIFO) memory.

The clean data strobe signal generating circuit may include a first receiver configured to receive a differential data strobe signal and output a first single ended data strobe signal, a second receiver configured to receive the second input data strobe signal and a reference signal, and based on the received second input data strobe signal and the received reference signal, output a second single ended data strobe signal, a memory gate signal generator configured to generate a memory gate signal having a pulse width, the memory gate signal including a burst length applied after the termination of a read latency, a gate signal generator configured to receive the first and second single ended data strobe signals and the memory gate signal, the gate signal generator generating a data strobe gate signal by counting a number of toggles of the first single ended data strobe signal based on the memory gate signal, and at least one logic gate configured to receive the first single ended data strobe signal and the data strobe gate signal, and generate a clean data strobe signal for receiving read data as a gating response.

The burst length may be equal to or larger than 16, the counting of the number of toggles of the first single ended data strobe signal is performed by a 3-bit counter.

The semiconductor memory device may be a Double Data Rate (DDR) DRAM configured to perform a ground voltage termination type of on-die termination operation.

Still another aspect of some example embodiments of the inventive concepts is directed to a read interface circuit which includes an input buffer configured to receive data from at least one memory device, a data receiving memory configured to store the received data transmitted from the input buffer in accordance with a data clock signal, and a clean data strobe signal generating circuit configured to receive a differential data strobe signal from the at least one memory device, and generate a clean data strobe signal, the clean data strobe signal used as the data clock signal.

The clean data strobe signal may include a first receiver, a second receiver, and a gate signal generator. The received differential data strobe signal includes a first input data strobe signal and a second input data strobe signal, the first receiver configured to receive the first input data strobe signal and the second input data strobe signal and output a first single ended data strobe signal, the second receiver configured to receive the second input data strobe signal and a reference voltage signal and output a second single ended data strobe signal, the gate signal generator configured to receive the first and second single ended data strobe signals and generate a data strobe gate signal based on the received first and second single ended data strobe signals, and the clean data strobe signal is further configured to generate the clean data strobe signal based on the data strobe gate signal and the first single ended data strobe signal.

The at least one memory device may be a volatile semiconductor device.

The at least one memory device may be a non-volatile semiconductor memory device.

The data receiving memory may be further configured to output the stored read data to a memory controller.

BRIEF DESCRIPTION OF THE FIGURES

The foregoing and other features of inventive concepts will be apparent from the more particular description of non-limiting example embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
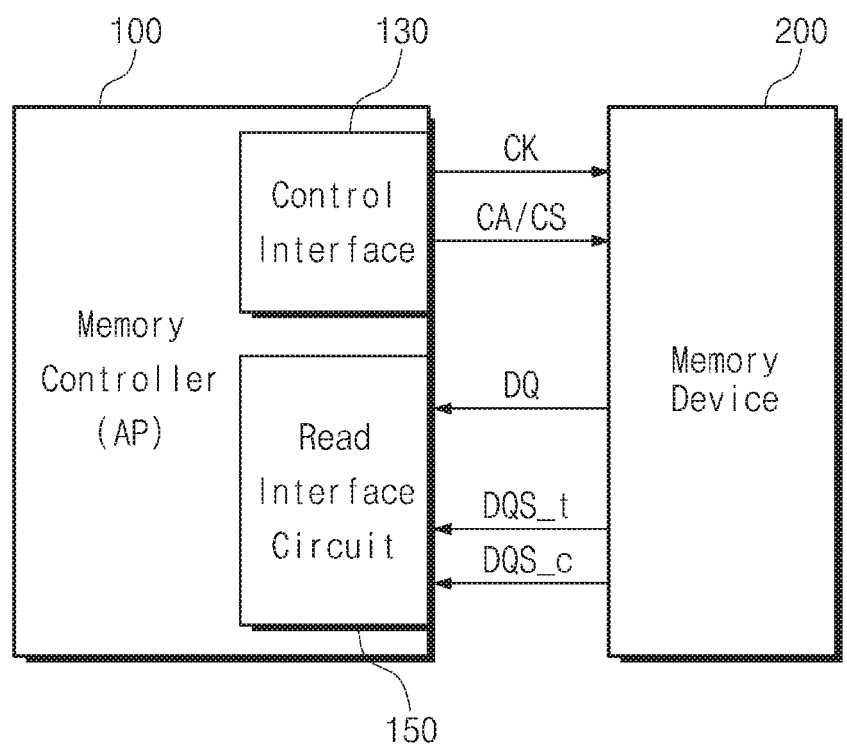
FIG. 1 is a block diagram illustrating a memory system according to at least one example embodiment of the inventive concepts.

Various example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Various example embodiments illustrated herein may include complementary example embodiments. Also, it should be noted that details of basic operations such as read operation and write operation of volatile memories like Dynamic Random Access Memories (DRAMs) and internal functional circuits for performing such basic operations will not be described in detail in order not to obscure the essential of the inventive concepts.

FIG. 1 is a block diagram illustrating a memory system to at least one example embodiment of the inventive concepts.

Referring to FIG. 1, a memory system may include a memory controller 100 and a memory device 200. The memory controller 100 may include a control interface 130 and a read interface circuit 150. The control interface 130 may apply clock CK, and command address CA and/or chip selection CS signals to the memory device 200. The read interface circuit 150 may function as a read interface device or a physical interface PHY and may receive read data and data strobe signals which are outputted from the memory device 200, e.g., DRAM.

The read interface circuit 150 may receive data DQ from the memory device 200 that may be a semiconductor memory device. Also, the read interface circuit 150 may receive a plurality of differential data strobe signals, including at least a first and second input data strobe signals DQS_t and DQS_c from the memory device 200. The phases of the first and second input data strobe signals DQS_t and DQS_c may be opposite to each other during a read operation of the memory device 200 (e.g., the DQS_t signal may be high and the DQS_c signal may be low during a read operation, or vice versa).

According to at least one example embodiment of the inventive concepts, the read interface circuit 150 may not include a gate training logic/function which was required by the conventional read interface circuits. In other words, read interface circuit 150 may omit a gate training logic/function. Advantageously, a corresponding black-out time may be reduced and/or eliminated, and the performance of the memory system is improved. Also, the size of the circuit may be minimized or reduced with the absence of the gate training logic/function.

Consequently, the read interface circuit 150 may generate a clean data strobe signal without requiring a delay line for gate training and/or a DLL circuit, or a control circuit, for delay control. Accordingly, the read data may be accurately received without an error by using the clean data strobe signal as a data clock signal for receiving the read data from the memory device 200.

Figure 2:
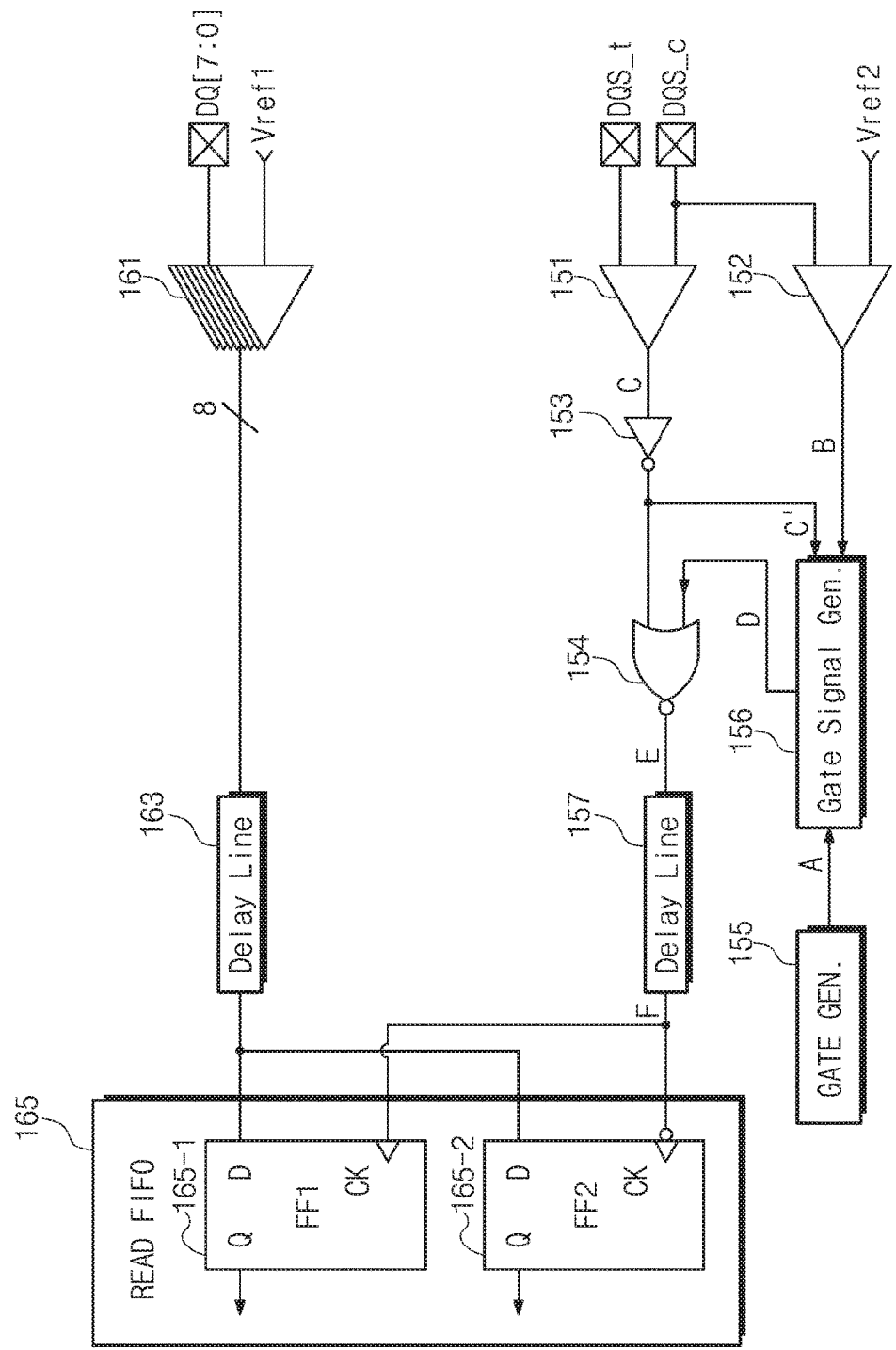
FIG. 2 is a block diagram illustrating a read interface device according to at least one example embodiment of the inventive concepts.

When a ground (VSSQ) termination type of on-die termination (ODT) operation is performed by the read interface circuit 150, the differential data strobe signal provided from the memory device 200 may be received as a dirty signal of a tri-state condition in a section besides a read operation section, or except a read operation section, of the signal. The reason is that when the ground VSSQ termination is performed on the differential data strobe signals in the section other than the read operation section, both the first and second input data strobe signals DQS_t and DQS_c have a ground (VSS) level. Accordingly, since a differential receiver inside the read interface circuit 150 cannot properly receive the differential signal, it may output a signal of an unknown state. Since an on-state section of ODT is wider than the read operation section, the unknown signal may exist in a front section and a rear section of the output signal of the differential receiver. Therefore, it is necessary to remove the signal in the unknown section and generate an integral data strobe signal. That is, to use a data strobe signal as a clock that makes it possible to accurately receive the read data, the signal in the unknown section needs to be masked, and the clean data strobe signal needs to be generated. In at least one example embodiment of the inventive concepts, using the read interface device 150 is provided as shown in FIG. 2, the clean data strobe signal may be generated without a gate training operation.

On the other hand, the memory controller 100 may be implemented as a processor, an application processor, a host, a System on Chip (SoC), and/or other processing device. The memory controller 100 may receive the read data through the read interface circuit 150. Although the read interface circuit 150 is shown as being included in the memory controller 100, the read interface circuit 150 may be independently installed between the memory controller 100 and the memory device 200, in other words, separate from the memory controller 100.

The memory device 200 may be a type of DRAM, such as an LPDDR4, mounted in an electronic device, for example a mobile device (e.g., a smart phone, a laptop computer, a notebook, a tablet, a portable multimedia player, a wearable device, a virtual reality device, etc.), and/or other computing device.

The memory device 200 may be configured in a form of memory module. In the memory module, a plurality of semiconductor memory devices may be mounted in a DIMM/POP/SCP type on a board such as Printed Circuit Board (PCB) and may include at least one or more ranks.

The memory module may change the states of received input signals by rank based on a mapping table defined in accordance with a mode resistor set (MRS) signal. The memory module may also control the plurality of semiconductor memory devices by rank. For example, when an input rank control signal selecting a first rank is received in the enable state from the memory controller 100, and an input rank control signal selecting a second rank is received in the disable state as well, a control buffer inside the memory module may change the input rank control signal from the disable state to the enable state to allow the read operation, the write operation, and/or the test operation to be simultaneously performed with respect to all of the first and second ranks.

The input signals may include a clock enable signal provided by memory device or rank, or an on-die termination signal DODT provided by memory device or rank, in addition to the rank control signal for selection by rank.

The memory module may have an RDIMM or LRDIMM structure and may constitute a high bandwidth memory system together with the memory controller 100.

FIG. 2 is a block diagram illustrating a read interface device according to at least one example embodiment of the inventive concepts.

Referring to FIG. 2, the read interface device may include a single ended type of input buffer 161, a data receiving memory 165, and a clean data strobe signal generating circuit 151, 152, 153, 154, 155 and 156.

The input buffer 161 may include a plurality of input buffers and may receive read data DQ provided from the semiconductor memory device. For example, the input buffer 161 may buffer read data to output as parallel 8-bit data. A first reference voltage Vref1 may be used as a reference signal for distinguishing between data 0 and data 1. For example, in the case of a 1.8 V swing (e.g., a difference in voltage), it may be assumed that the first reference voltage Vref1 may be set to about 0.9 V and a voltage of about 1.0 V is received as data 1. Since the voltage of about 1.0 V is greater than about 0.9 V, the input buffer 161 may consider that data 1 is received and may perform buffering output of about 1.8 V (e.g., the voltage may be increased to 1.8 V). That is, weak data 1 may be changed into strong data 1 to be outputted.

The data receiving memory 165 may be implemented with a First-In First-Out (FIFO) memory or FIFO queue in which the first data input is the first outputted. The data receiving memory 165 may store output read data outputted from the input buffer 161 in response to the data clock CK and may output the output read data to a data receiving device such as the memory controller 100.

The data receiving memory 165 may include a first flip-flop 165-1 and a second flip-flop 165-2. A delay line 163 connected between data input terminals D of the first and second flip-flops 165-1 and 165-2 and the input buffer 161 may serve to compensate for a skew between the data and the clock signal (e.g., clock skew).

A delay line 157 connected to clock input terminals CK of the first and second flip-flops 165-1 and 165-2 may serve to compensate for a clock skew.

According to at least one example embodiment, the first flip-flop 165-1 may receive, for example, Double Data Rate (DDR) data outputted from the input buffer 161 in synchronization with a rising edge of the clean data strobe signal applied to the clock input terminal CK and may output Single Data Rate (SDR) data to a data output terminal Q, but the example embodiments are not limited thereto.

The second flip-flop 165-2 may receive, for example, DDR data outputted from the input buffer 161 in synchronization with a falling edge of the clean data strobe signal applied to the clock input terminal CK and may output DDR data to a data output terminal Q.

On the other hand, when data output from the input buffer 161 is QDR data, DDR data may be respectively output to the data output terminals Q of the first and/or second flip-flops 165-1 and 165-2.

The clean data strobe signal generating circuit may generate a clean data strobe signal E as the data clock CK using a memory gate signal A having a pulse width to which a burst length BL is applied after the termination of a read latency and a differential data strobe signal is provided from the semiconductor memory device.

The clean data strobe signal generating circuit may include first and second receivers 151 and 152, a memory gate signal generator 155, a gate signal generating unit 156 (e.g., a gate signal generator), and a gating unit 153 and 154 (e.g., logic gates).

The gating unit may include an inverter 153 and a NOR gate 154, but when the inverter 153 is removed, the NOR gate 154 may be changed into an AND gate.

The first receiver 151 may receive a differential data strobe signal including a first and second input data strobe signals DQS_t and DQS_c, and may output a first single ended data strobe signal C.

The second receiver 152 may receive the second input data strobe signals DQS_c and a reference signal such as a reference voltage Vref2 to output a second single ended data strobe signal B. Here, the reference voltage Vref2 may be set to have half the swing level of the second input data strobe signal DQS_c according to at least one example embodiment, but the reference voltage Vref2 is not limited thereto.

The memory gate signal generator 155 may generate the memory gate signal A having a pulse width to which the burst length is applied after the termination of the read latency. The memory gate signal generator 155 may control the pulse width and the timing generation of the memory gate signal A in response to a control setting.

The gate signal generating unit 156 may receive the first and second single ended data strobe signals C and B and the memory gate signal A. Based on the memory gate signal A, the gate signal generating unit 156 may count the number of toggles of the first single ended data strobe signal C to generate a data strobe gate signal D.

The gating unit 153 and 154 may receive the first single ended data strobe signal C and the data strobe gate signal D and may generate a clean data strobe signal E for receiving read data as a gating response.

Figure 3:
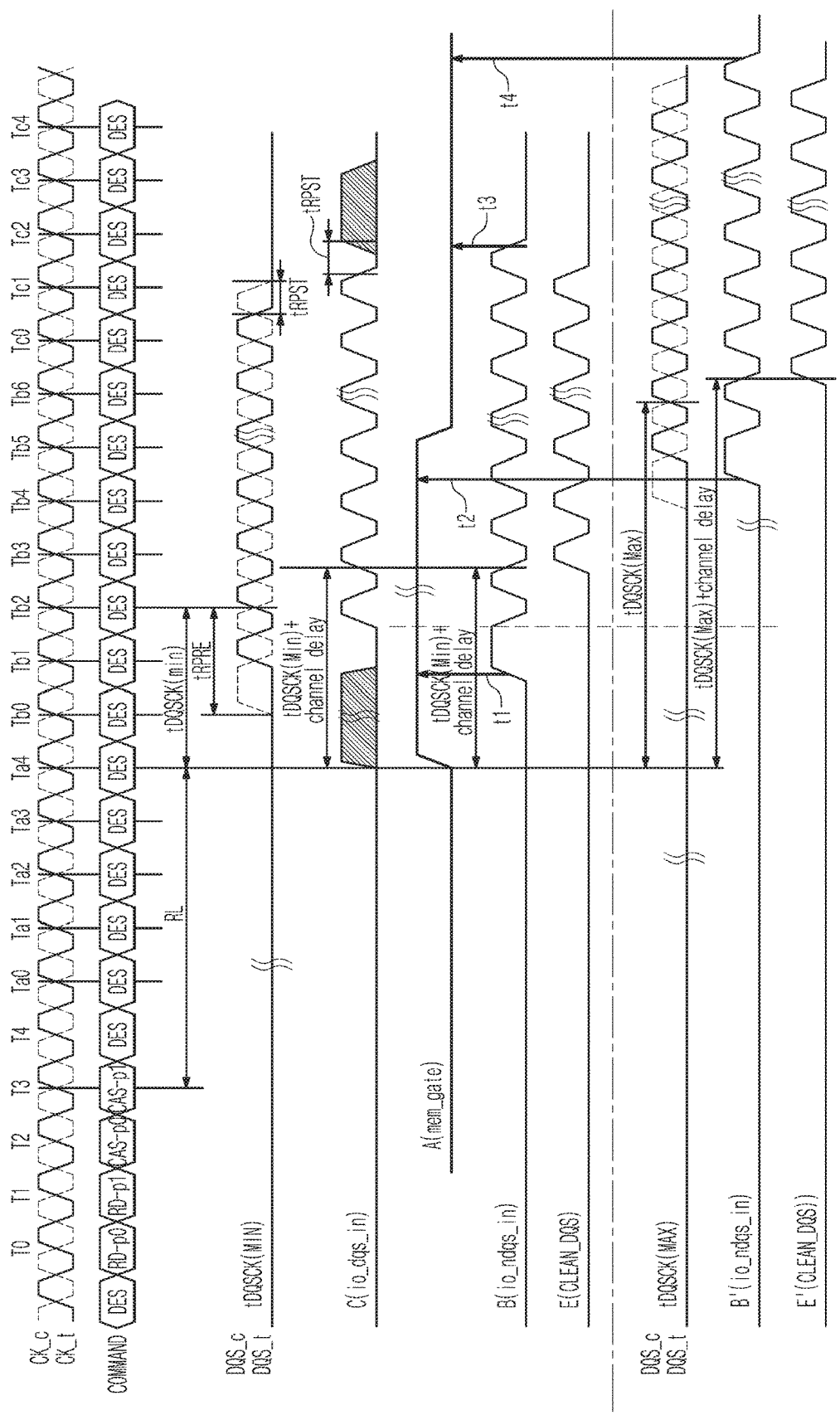
FIG. 3 is a timing diagram illustrating an example of an operation according to FIG. 2 according to at least one example embodiment of the inventive concepts.

FIG. 3 is a timing diagram illustrating an example embodiment of an operation according to FIG. 2.

Referring to FIG. 3, the horizontal axis denotes time in increments of nanoseconds, and the vertical axis denotes the voltage level of each signal.

A differential clock signal may include first and second clock signals CK_t and CK_c which are clocked in opposite phases from each other as shown in FIG. 3.

When a read command is received and the read latency RL elapses, in the case of tDQSCK(MIN), the first and second input data strobe signals DQS_t and DQS_c constituting the differential data strobe signal may be shown as the third waveform from the top of FIG. 3.

Here, tDQSCK(MIN) indicates that the skew between DQS and CK is minimal. Also, tRPRE indicates the preamble section of DQS, and tRPST indicates the postamble section of DQS.

As illustrated in the above timing diagram, the first single ended data strobe signal C of FIG. 2 may be shown as a signal waveform C(io_dqs_in) of FIG. 3. That is, an unknown signal generation section may be shown in a section prior to the preamble of the signal waveform C(io_dqs_in). Also, an unknown signal generation section may exist in a section following the postamble of the signal waveform C(io_dqs_in).

The memory gate signal A may be generated like waveform A(mem_gate) to generate the clean data strobe signal E by masking the unknown signal generation section. The waveform A(mem_gate) may be generated by the memory gate signal generator 155 and may be a signal of which the pulse width (e.g., the pulse width of high level in FIG. 3) varies in accordance with the burst length BL after the termination of the read latency RL. The pulse width of the memory gate signal A may be set to have half the pulse width of the burst length. However, this is merely an example embodiment of the inventive concepts, and the inventive concepts are not limited thereto.

Also, the second single ended data strobe signal B may be generated similar to waveform B(io_ndqs_in) of FIG. 3. The first rising edge of the waveform B(io_ndqs_in) may start at a point in time t1 within a section where the waveform A(mem_gate) is maintained high, and the last falling edge may end at a point in time t3 within a section where the waveform A(mem_gate) is maintained low. In other words, after RL, the data strobe gate signal D synchronized with the signal waveform C(io_dqs_in) may be obtained using the first rising edge and the last falling edge of the waveform B(io_ndqs_in) and the waveform A(mem_gate) having a length of BL/2. The gating of the signal waveform C(io_dqs_in) and the data strobe gate signal D may enable the clean data strobe signal E to be generated without a signal training process.

Consequently, the signal of the unknown section may be removed, and the clean data strobe signal E may be obtained by the clean data strobe signal generating circuit of FIG. 2 similar to waveform E(CLEAN_DQS) of FIG. 3.

Additionally, when a read command is received and the read latency RL elapses, in the case of tDQSCK(MAX), the first and second input data strobe signals DQS_t and DQS_c constituting the differential data strobe signal may be shown as the third waveform from the bottom of FIG. 3.

Here, tDQSCK(MAX) indicates that the skew between DQS and CK is at a maximum. In the above timing diagram, the memory gate signal A may be generated like waveform A(mem_gate) to generate the clean data strobe signal E' by masking the unknown signal generation section.

Also, the second single ended data strobe signal B may be generated like a waveform B'(io_ndqs_in) of FIG. 3. The first rising edge of the waveform B'(io_ndqs_in) may start at a point in time t2 within a section where the waveform A(mem_gate) is maintained high, and the last falling edge may end at a point in time t4 within a section where the waveform A(mem_gate) is maintained low. In other words, after RL, the data strobe gate signal D may be obtained using the first rising edge and the last falling edge of the waveform B'(io_ndqs_in) and the waveform A(mem_gate) having a length of BL/2. The gating of the signal waveform C(io_dqs_in) and the data strobe gate signal D may enable the clean data strobe signal E to be generated without a signal training process.

Consequently, the signal of the unknown section may be removed, and the clean data strobe signal E may be obtained by the clean data strobe signal generating circuit of FIG. 2 like a waveform E'(CLEAN_DQS) of FIG. 3.

As shown in FIG. 3, when the memory gate signal A is used, the clean data strobe signal E in which the fluctuation is compensated may be obtained without a separate training operation even though there is a fluctuation between tDQSCK(MAX) and tDQSCK(MIN). Also, BL=32/seamless (continuous burst read, 16 times) may be supported on the basis unit of BL=16.

Figure 4:
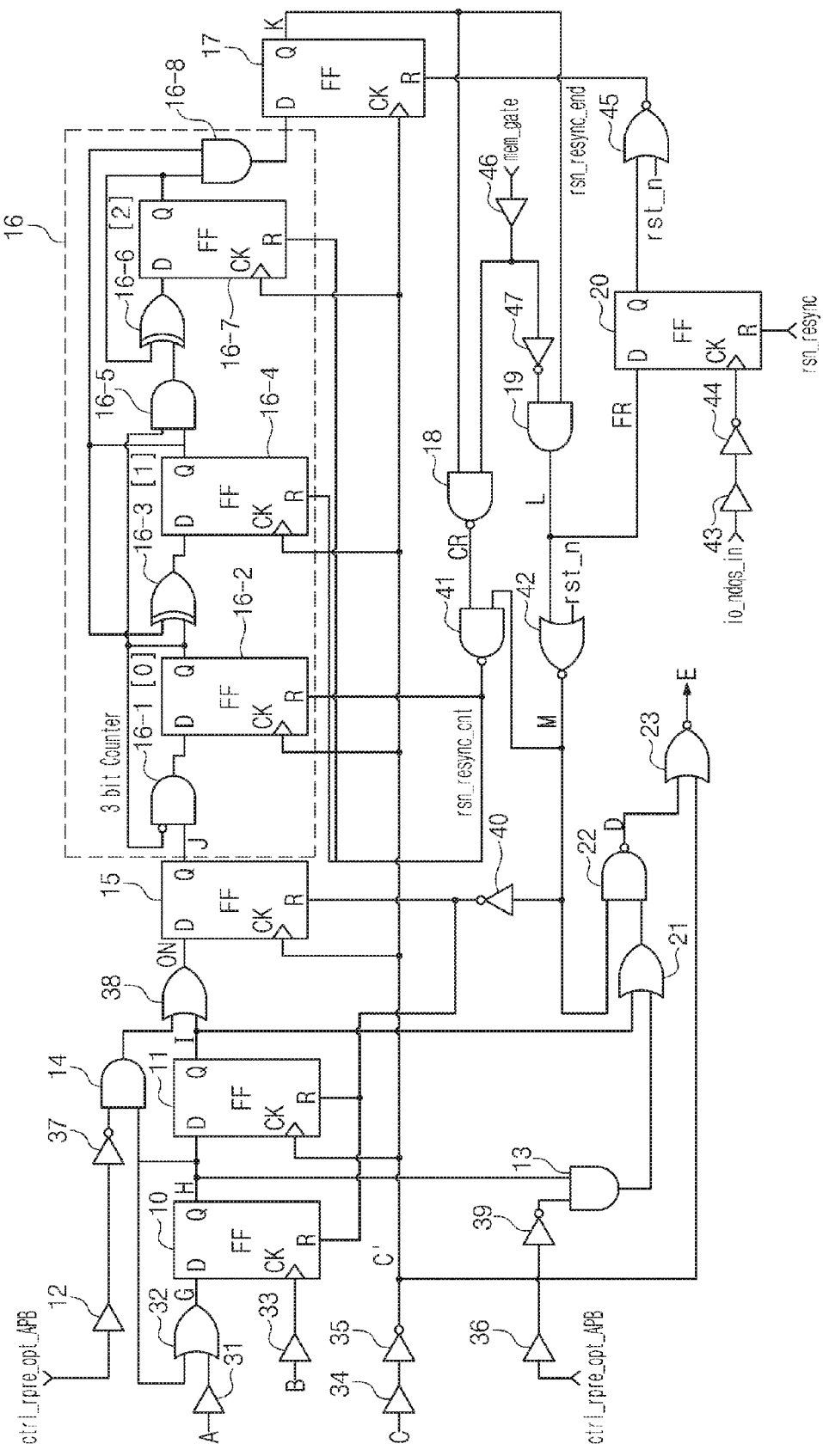
FIG. 4 is a circuit diagram illustrating a clean data strobe signal generating circuit according to at least one example embodiment of the inventive concepts.

FIG. 4 is a circuit diagram illustrating a clean data strobe signal generating circuit according to at least one example embodiment of the inventive concepts. Also, FIG. 5 is a timing diagram illustrating an example of an operation according to FIG. 4 according to at least one example embodiment.

Referring to FIG. 4, the clean data strobe signal generating circuit may include buffers 12, 31, 33, 34, 36, 43 and 46, inverters 37, 39, 40, 44 and 47, gates 13, 14, 18, 19, 21, 22, 32, 38, 41, 42 and 45, flip-flops 10, 11 and 17, and a counter 16. In FIG. 4, the inverter 35 may correspond to the inverter 153 of FIG. 2, and a NOR gate 23 may correspond to the NOR gate 154 of FIG. 2. Accordingly, when the inverter 35 is removed, the NOR gate 23 may be changed into an AND gate.

The counter 16 may be a 3-bit counter and may be implemented with gates 16-1, 16-3, 16-5, 16-6 and 16-8 and flip-flops 16-2, 16-4 and 16-7.

Figure 5:
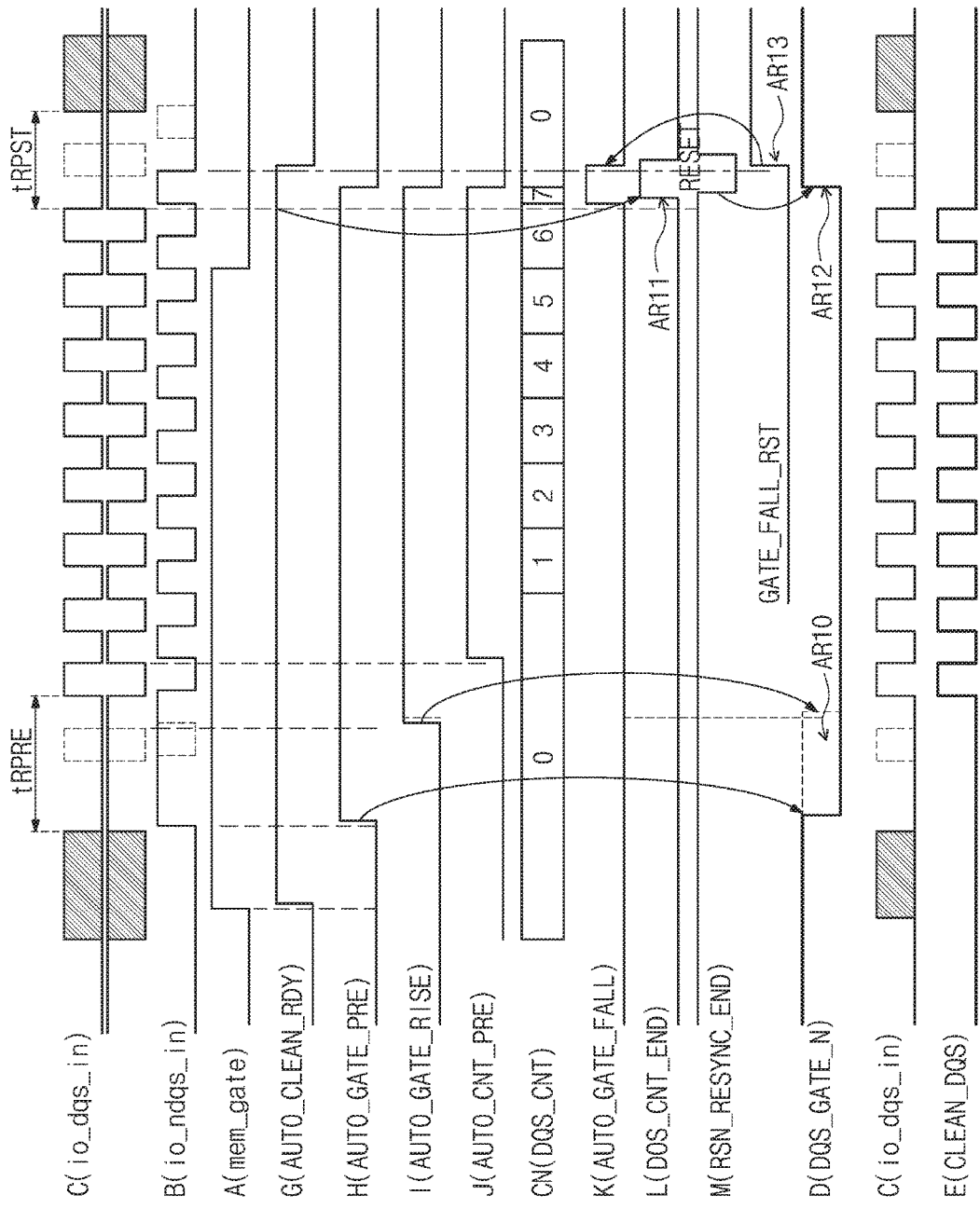
FIG. 5 is a timing diagram illustrating an example of an operation according to FIG. 4 according to at least one example embodiment of the inventive concepts.

When the burst length is 16, the memory gate signal A applied to the buffer 31 may be shown as a waveform A(mem_gate) of FIG. 5.

Also, the first single ended data strobe signal C applied to the buffer 34 may be shown as a signal waveform C(io_dqs_in) of FIG. 5 as described with reference to FIG. 3.

On the other hand, the second single ended data strobe signal B applied to the buffer 33 may be generated like a waveform B(io_ndqs_in) of FIG. 5.

The OR gate 32 may generate a waveform G(AUTO_CLEAN_READY) of FIG. 5, and the D flip-flop 10 may capture (or latch) a signal G applied to an input terminal D in response to a signal B applied to a clock terminal CK and may output a signal H like a waveform H(AUTO_GATE_PRE) of FIG. 5. The D flip-flop 10 may allow the transition point in time of a waveform D(DQS_GATE_N) to be determined by generating the waveform H(AUTO_GATE_PRE) that responds to the first rising edge of the waveform B(io_ndqs_in). Also, the D flip-flop 11 may capture the signal H and may output a signal I like a waveform I(AUTO_GATE_RISE) of FIG. 5. When an extra preamble toggle option is used in a memory device, the D) flip-flop 11 may allow the transition point in time of the waveform D(DQS_GATE_N) to become a point in time after extra toggling, by generating the waveform I(AUTO_GATE_RISE) responding to the second rising edge.

Here, the signal H may be generated when extra toggling does not exist in the second single ended data strobe signal B, and the signal I may be generated when extra toggling exists in the second single ended data strobe signal B as indicated by the dotted line. That is, when extra toggling exists, a relatively short pulse may be shown, and when extra toggling does not exist, a relatively long pulse may be shown. The preamble extra toggle option may be selectively provided in an LP DDR4 DRAM. The buffer 12 may receive a signal ctrl_rpre_opt_APB as an extra, preamble toggle option ON/OFF setting signal.

In the case of the waveform D(DQS_GATE_N) of FIG. 5, the transition point in time from high level to low level may vary according to the presence or absence of extra toggling as shown by arrow AR10. That is, when there is no extra toggling, the transition point in time may become earlier than when there is extra toggling because of synchronization with the waveform H(AUTO_GATE_PRE). When there is extra toggling, the transition point in time may become later than when there is no extra toggling because of the transition point in time of the waveform D(DQS_GATE_N) that is synchronized with the waveform I(AUTO_GATE_RISE). Consequently, when there is extra toggling, the pulse width of the low section of the waveform D(DQS_GATE_N) may become relatively narrower.

Regardless of the presence or absence of extra toggling, the unknown state in the front section may be sufficiently masked and removed as seen through the clean data strobe signal E.

Additionally, the AND gate 14 may output a signal AUTO_RPRE_OPT. Accordingly, when extra preamble toggling is off, toggling of the signal C may be reduced by 1 cycle, and thus it is as if the waveform H(AUTO_CLEAN_PRE) is directly applied to the D flip-flop 15.

A waveform J(AUTO_CNT_PRE) may be generated by the flip-flop 15 of FIG. 4. The flip-flop 15 may serve to allow the counter 16 to operate again when the data burst is not terminated even though the counter 16 is initialized.

The counter 16 may count the number of toggles as shown in a waveform CN(DQS_CNT) of FIG. 5. That is, when BL=16, toggling of the signal C may occur by the multiple of 16 according to this example. In at least one example embodiment of the inventive concepts, the pulse width section of low level of the waveform D(DQS_GATE_N) may be determined using a 3-bit counter, but is not limited thereto. The counter 16 may start to count the falling edge of the toggling signal C after the waveform J(AUTO_CNT_PRE) transitions to high level. The counting operation of the counter 16 may last until the falling edge is counted to 7.

A signal K may be generated by the flip-flop 17 like a waveform K(AUTO_GATE_FALL) of FIG. 5.

Also, a signal CR may be generated as a waveform (DQS_CNT_RTN) by the NAND gate 18. That is, in the case where the waveform A(mem_gate) is high when the waveform K(AUTO_GATE_FALL) goes to a high level, a counter return signal which informs that a data burst is not terminated may be generated.

Figure 9:
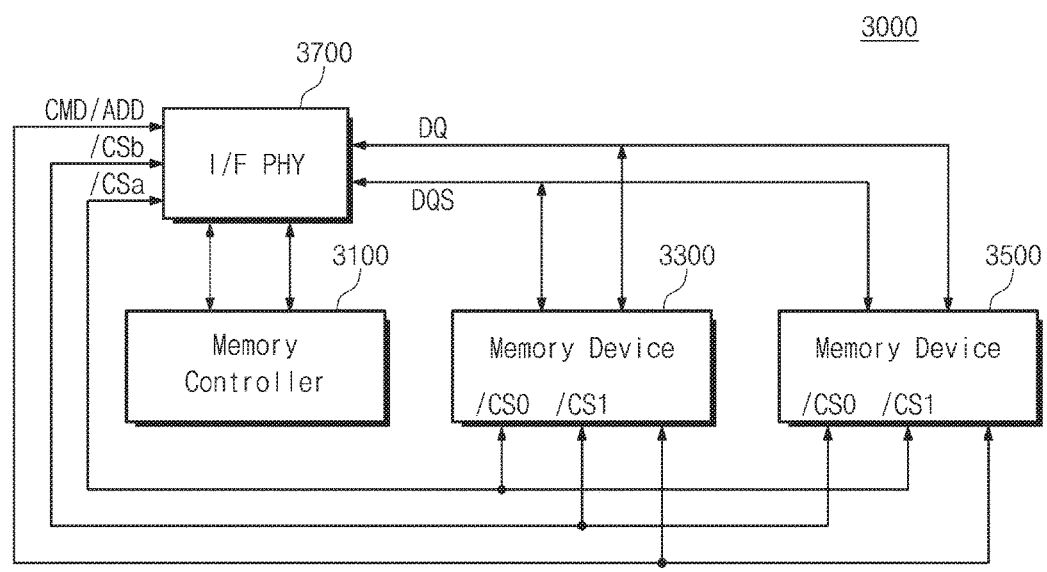
FIG. 9 is a configuration diagram illustrating an interfacing device including a clean data strobe signal generating circuit according to at least one example embodiment of the inventive concepts.

A signal L may be generated as a waveform L(DQS_CNT_END) by the AND gate 19. When the waveform K(AUTO_GATE_FALL) has a high level and the waveform A(mem_gate) has a low level, the AND gate 19 may output the signal L like a waveform L(DQS_CNT_END) which indicates that the data burst is terminated. When the count value is 7 and the waveform A(mem_gate) is in a low level, arrow AR11 of FIG. 9 shows that the waveform L(DQS_CNT_END) transitions from the low level to a high level. The generation of the waveform L(DQS_CNT_END) may provide a feedback reset schema which initializes the gate signal generating unit 156.

The NOR gate 42 may output a signal M like a waveform M(RSN_RESYNC_END) of FIG. 5 according to at least one example embodiment.

The OR gate 21 may receive the output of the AND gate 13 and the signal I to generate an OR response. The OR response of the OR gate 21 may be shown as a signal GATE_RISE.

The AND gate 22 may receive the signal M and the signal GATE_RISE to generate an AND response. The AND response of the AND gate 22 may become a data strobe gate signal D having a window of low level similar to the waveform D(DQS_GATE_N) of FIG. 5. Arrow AR12 shows the transition of the waveform D(DQS_GATE_N) to a high level in response to a reset pulse RESET in which the signal M transitions from a high level to a low level. Accordingly, DQS toggle (e.g., an extra postamble toggle) after tRPST (postamble) may be masked, or the DQS noise may be masked.

On the other hand, the flip-flop 20 may output a waveform GATE_FALL_RST of FIG. 5 (for example, as FR of FIG. 4) to provide for one input terminal of the NOR gate 45. The reset of the D flip-flop 17 may be performed using the last falling edge of the waveform B(io_ndqs_in) in order to enable the waveform CR(DQS_CNT_RTN) and the waveform L(DQS_CNT_END) to be maintained for at least tCK/2.

Arrow AR13 shows that the flip-flop 17 is reset in synchronization with the last falling edge of the waveform B(io_ndqs_in).

The NOR gate 23 may perform NOR gating on the output signal D of the AND gate 22 and the signal C to generate a clean data strobe signal E that is a desired signal. The clean data strobe signal E may be a clean signal in which the unknown signal is removed as shown in the waveform E(CLEAN_DQS) of FIG. 5.

Since the operation as shown in FIG. 5 can be performed using the circuit of FIG. 4, a clean data strobe signal may be generated without a delay control circuit and without performing a training operation.

Figure 6:
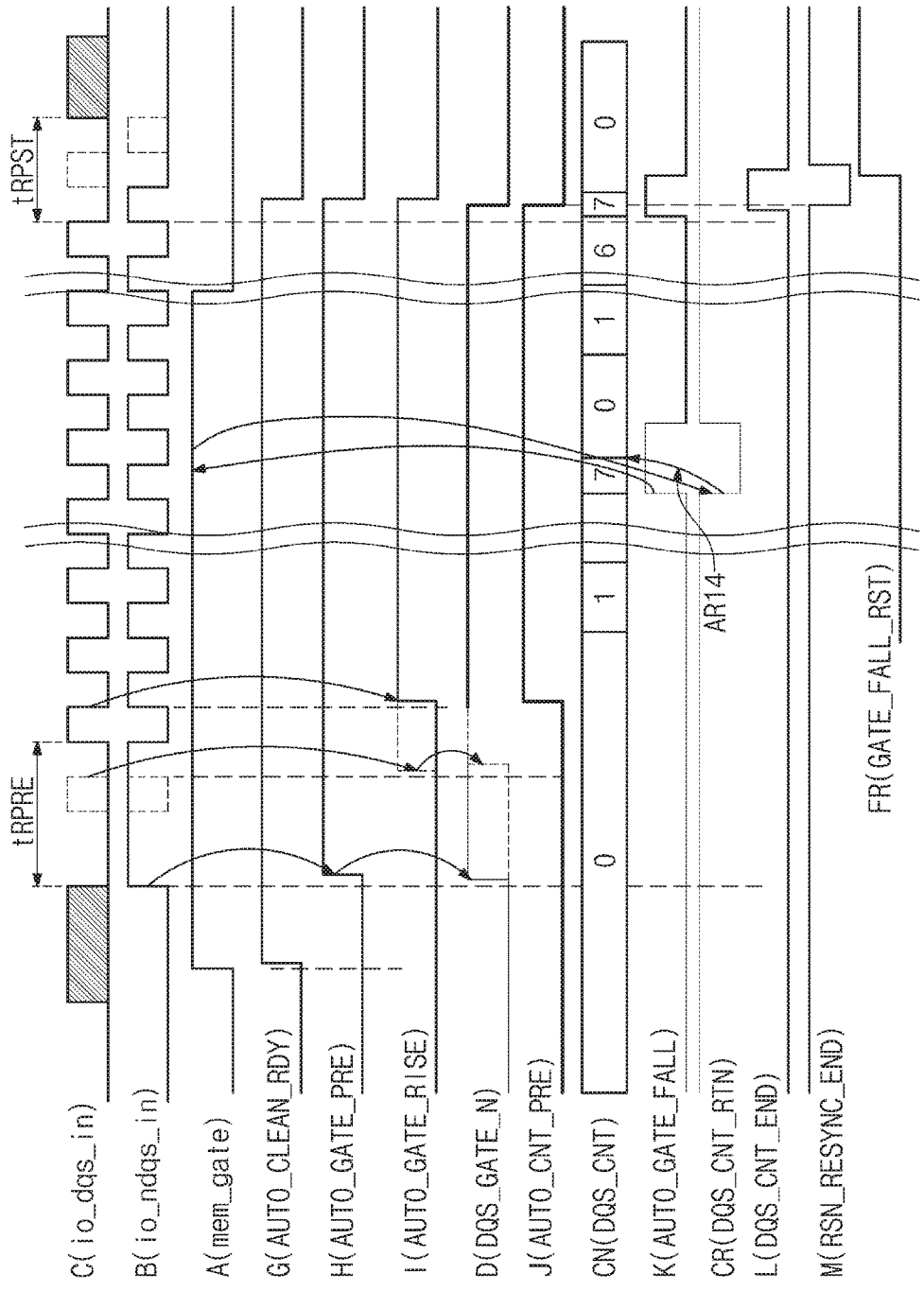
FIG. 6 is a timing diagram illustrating another example of an operation according to FIG. 4 according to at least one example embodiment of the inventive concepts.

FIG. 6 is a timing diagram illustrating another example of an operation according to FIG. 4 according to at least one example embodiment.

FIG. 6 shows that the counting operation of the counter 16 resumes when BL=32. The signal waveforms of FIG. 6 that are identical to the signal waveforms of FIG. 5 and are labeled using the same reference symbols.

A waveform CR(DQS_CNT_RTN) of FIG. 6 may be generated from the NAND gate 18 of FIG. 4, and a waveform FR(GATE_FALL_RST) may be generated from the DI flip-flop 20 of FIG. 4.

When a signal K goes to a high level like a waveform K(AUTO_GATE_FALL) and BL=32, a waveform A(mem_gate) may also be high in level. In this case, a signal CR representing that data burst is still not terminated may be generated as a waveform (DQS_CNT_RTN) by the NAND gate 18. That is, when both the waveform K(AUTO_GATE_FALL) and the waveform A(mem_gate) are at a high level, a counter return signal which indicates that a data burst is not terminated may be generated. Accordingly, the counter 16 may be initialized and may restart data burst counting as indicated by arrow AR14.

Figure 7:
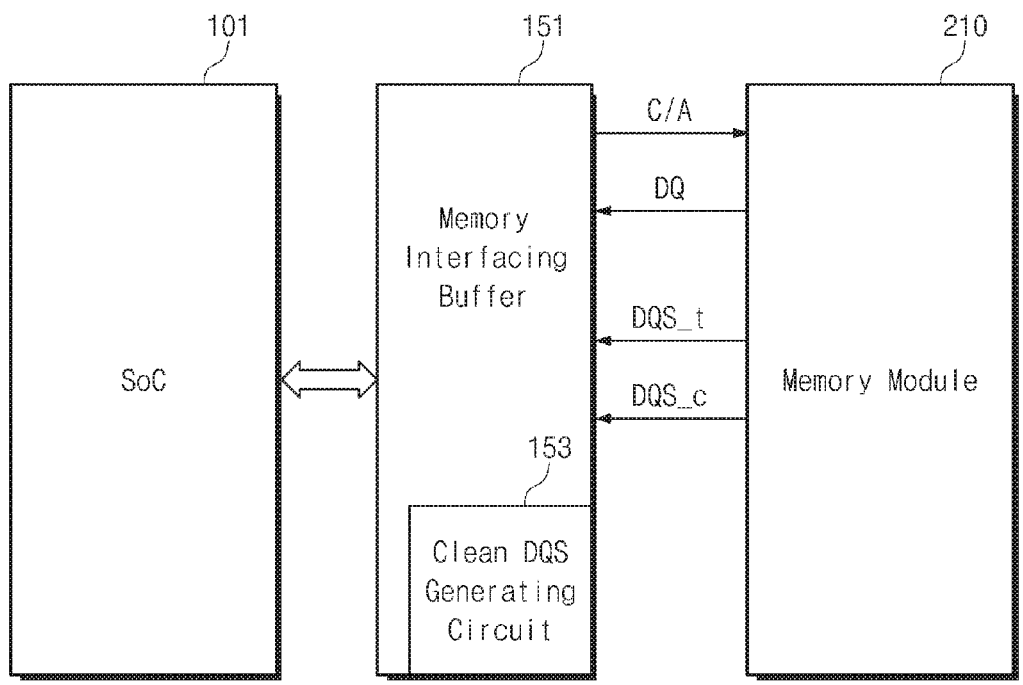
FIG. 7 is a block diagram illustrating another memory system according to at least one example embodiment of the inventive concepts.

FIG. 7 is a block diagram illustrating another memory system according to at least one example embodiment of the inventive concepts.

Referring to FIG. 7, a memory system may include a SoC 101, a memory interfacing buffer 151, and a memory module 210.

The SoC 101 may perform a function of a memory controller.

The memory interfacing buffer 151 may include a clean data strobe signal generating circuit 153 as described with reference to FIG. 4.

The memory interfacing buffer 151 may apply command/address C/A to the memory module 210. The command/address C/A may be provided from the SoC 101.

The memory interfacing buffer 151 may receive data DQ from the memory module 210. Also, the memory interfacing buffer 151 may receive a differential data strobe signal including a first and second input data strobe signals DQS_t and DQS_c from the memory module 210. Similarly, the phases of the first and second input data strobe signals DQS_t and DQS_c may be opposite to each other when a differential relationship is accurately maintained.

Since the memory interfacing buffer 151 includes a clean data strobe signal generating circuit 153, the memory interfacing buffer 151 may not be provided with a separate gate training logic or function. Accordingly, the black-out time caused by signal training can be reduced, and the performance of the memory system may be improved.

Figure 8:
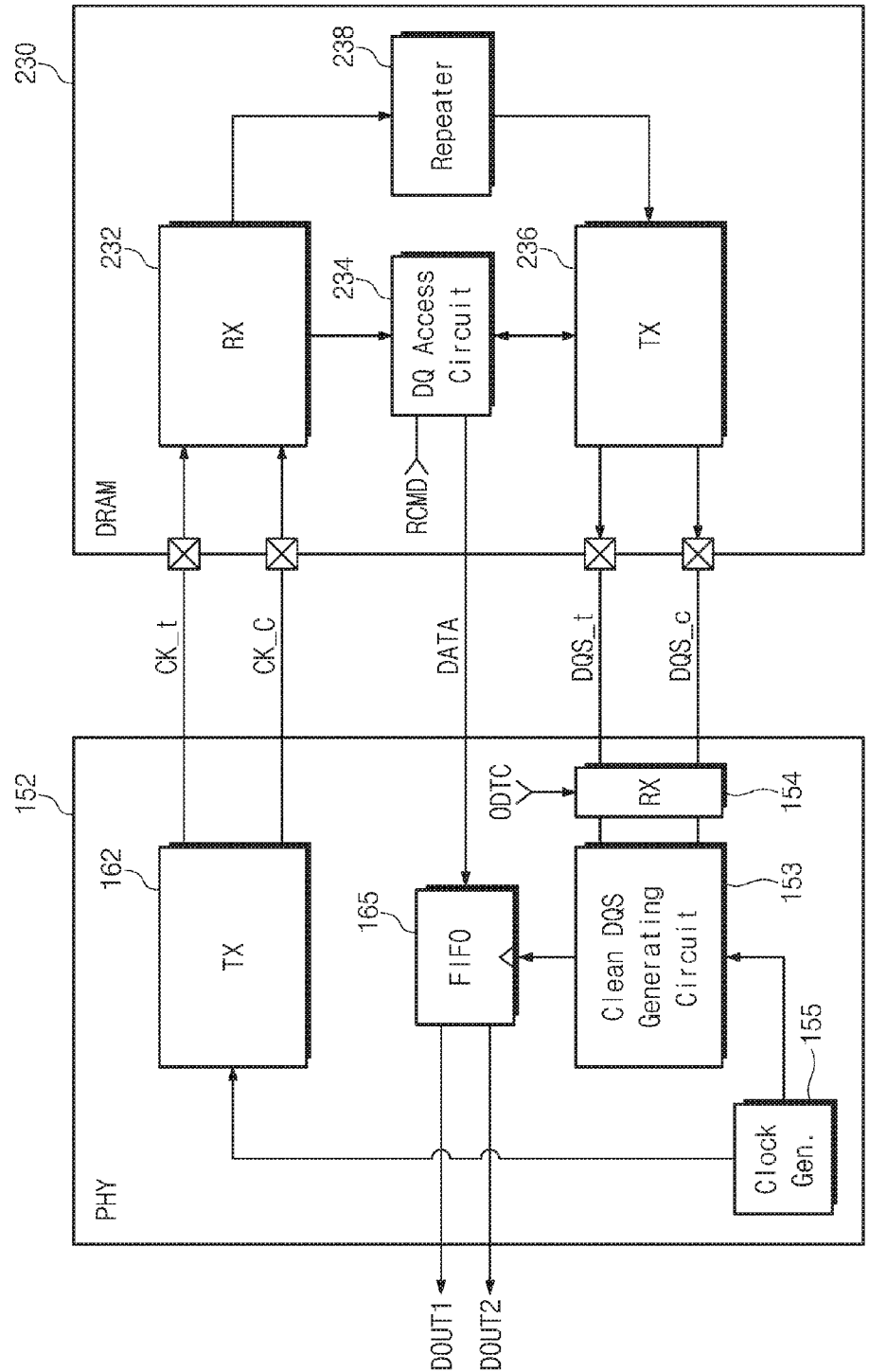
FIG. 8 is a detailed block diagram illustrating a modified example embodiment of a memory interfacing buffer of FIG. 7.

FIG. 8 is a detailed block diagram illustrating a modified example embodiment of a memory interfacing buffer of FIG. 7.

Referring to FIG. 8, the memory interfacing buffer may be implemented in a form of PHY 152.

The PHY 152 may include a transmitter 162, a FIFO memory 165, a clean data strobe signal generating circuit 153, a receiver 154, and a clock generator 155, but is not limited thereto.

A DRAM 230 may include a reception buffer 232, a data access circuit 234, a repeater 238, and a transmission buffer 236.

The transmitter 162 receiving a clock from the clock generator 155 may apply a differential clock signal including first and second clock signals CK_t and CK_c to the reception buffer 232 of the DRAM 230.

The first and second clock signals CK_t and CK_c may be single-ended through the reception buffer 232, and then may be provided for the transmission buffer 236 through the repeater 238. The transmission buffer 236 may transmit a differential data strobe signal including first and second input data strobe signals DQS_t and DQS_c using the single ended clock signal.

The data access circuit 234 may output read data DATA in response to a read command RCMD.

The receiver 154 may receive an on-die terminal control signal ODTC. The receiver 154 may receive the first and second input data strobe signals DQS_t and DQS_c under a VSSQ ODT operation during the data read operation.

When the differential data strobe signal including the first and second input data strobe signals DQS_t and DQS_c is received by the receiver 154, a signal in an unknown section may be removed by the clean data strobe signal generating circuit 153 from the differential data strobe signal.

Accordingly, since the clean data strobe signal does not have a tri-state section is applied to the clock terminal of the FIFO memory 165, read data may be accurately received. The FIFO memory 165 may receive DDR read data and may output SDR data to output terminals DOUT1 and DOUT2, respectively.

FIG. 9 is a configuration diagram illustrating an interfacing device including a clean data strobe signal generating circuit according to at least one example embodiment of the inventive concepts.

Referring to FIG. 9, an I/F PHY 3700 may be connected to a memory controller 3100. The I/F PHY 3700 may be an interfacing device and may correspond to the PHY 152 of FIG. 8.

The I/F PHY 3700 may interface signals between the memory controller 3100 and a memory device 3300 and between the memory controller 3100 and a memory device 3500.

Similarly, the I/F PHY 3700 may receive read data DQ and a differential data strobe signal DQS from the memory device 3300 or the memory device 3500.

The memory controller 3100 may apply command/address signal CMD/ADD to the memory device 3300 or the memory device 3500 through the I/F PHY 3700.

The memory controller 3100 may apply a first chip selection signal/CSa to the memory device 3300 or the memory device 3500 through the I/F PHY 3700.

The memory controller 3100 may apply a second chip selection signal/CSb to the memory device 3300 or the memory device 3500 through the I/F PHY 3700.

The memory device 3300 may be accessed by a unit of rank in accordance with the first chip selection signal/CSa and the second chip selection signal/CSb. Similarly, the memory device 3500 may also be accessed by a unit of rank in accordance with the first chip selection signal/CSa and the second chip selection signal/CSb.

Even when the differential data strobe signal including a tri-state signal in the unknown section is received, the I/F PHY 3700 may generate a clean data strobe signal by performing the signal cleaning operation as shown in FIG. 5 or 6. Accordingly, the memory controller 3100 may accurately receive read data without an error.

Figure 10:
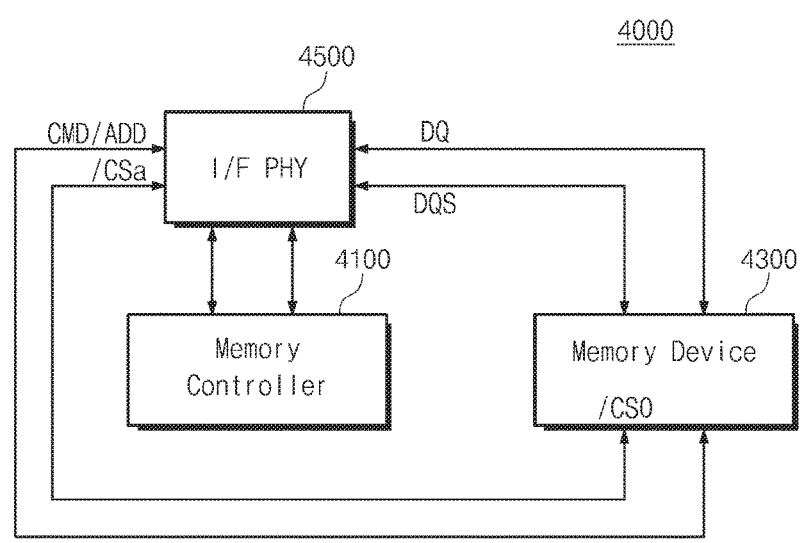
FIG. 10 is a configuration diagram illustrating an interfacing device including a clean data strobe signal generating circuit according to at least one example embodiment of the inventive concepts.

FIG. 10 is a configuration diagram illustrating an interfacing device including a clean data strobe signal generating circuit according to another example embodiment of the inventive concepts.

Referring to FIG. 10, an I/F PHY 4500 may be connected to a memory controller 4100, but is not limited thereto. The I/F PHY 4500 may be an interfacing device and may correspond to the PHY 152 of FIG. 8.

The I/F PHY 4500 may interface signals between the memory controller 4100 and a memory device 4300.

Similarly, the IF PHY 4500 may receive read data DQ and a differential data strobe signal DQS from the memory device 4300.

The memory controller 4100 may apply command/address signal CMD/ADD to the memory device 4300 through the I/F PHY 4500 and may apply a chip selection signal/CSa to the memory device 4300.

The memory device 4300 may be enabled by the chip selection signal/CSa to perform an operation according to the command indicated by the CMD/ADD signal.

Even when the differential data strobe signal including a tri-state signal in the unknown section is received, the I/F PHY 4500 may generate a clean data strobe signal, without a gate training operation, by performing the signal cleaning operation as shown in FIG. 5 or 6. Accordingly, the memory controller 4100 may accurately receive read data without an error.

Figure 11:
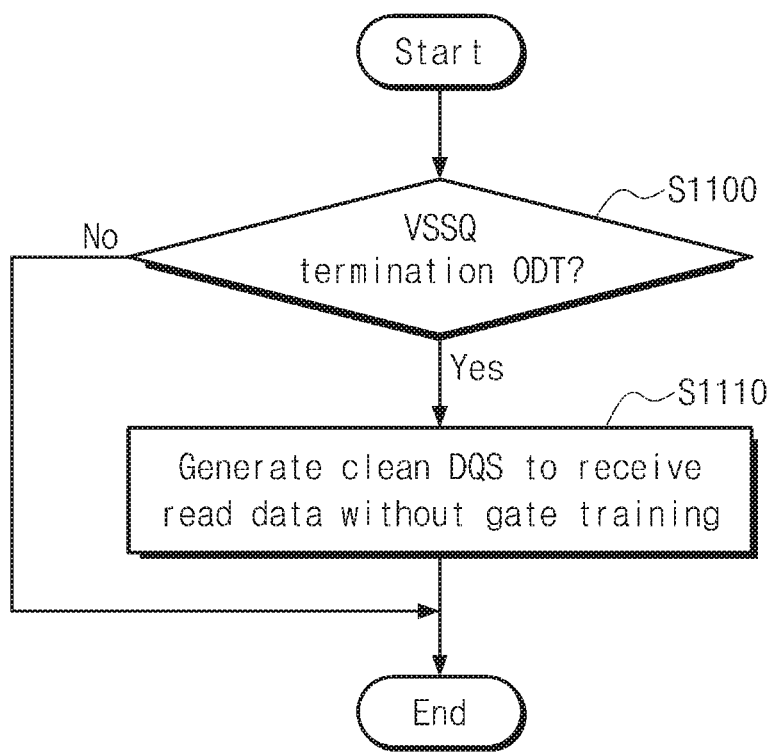
FIG. 11 is a flowchart illustrating generation of a clean data strobe signal according to at least one example embodiment of the inventive concepts.

FIG. 11 is a flowchart illustrating generation of a clean data strobe signal according to at least one example embodiment of the inventive concepts.

Referring to FIG. 11, when a ground VSSQ termination type of ODT control is performed (S1100), a clean data strobe signal may be generated (S1110). That is, the generation of the clean data strobe signal (S1110) as described with reference to FIG. 5 or 6 may occur during the ground VSSQ termination type of ODT control (S1100). If ODT control is performed by a VDD termination type or a half VDD terminal type instead of the ground VSSQ termination type, the generation (S1110) operation of the clean data strobe signal may be changed.

Figure 12:
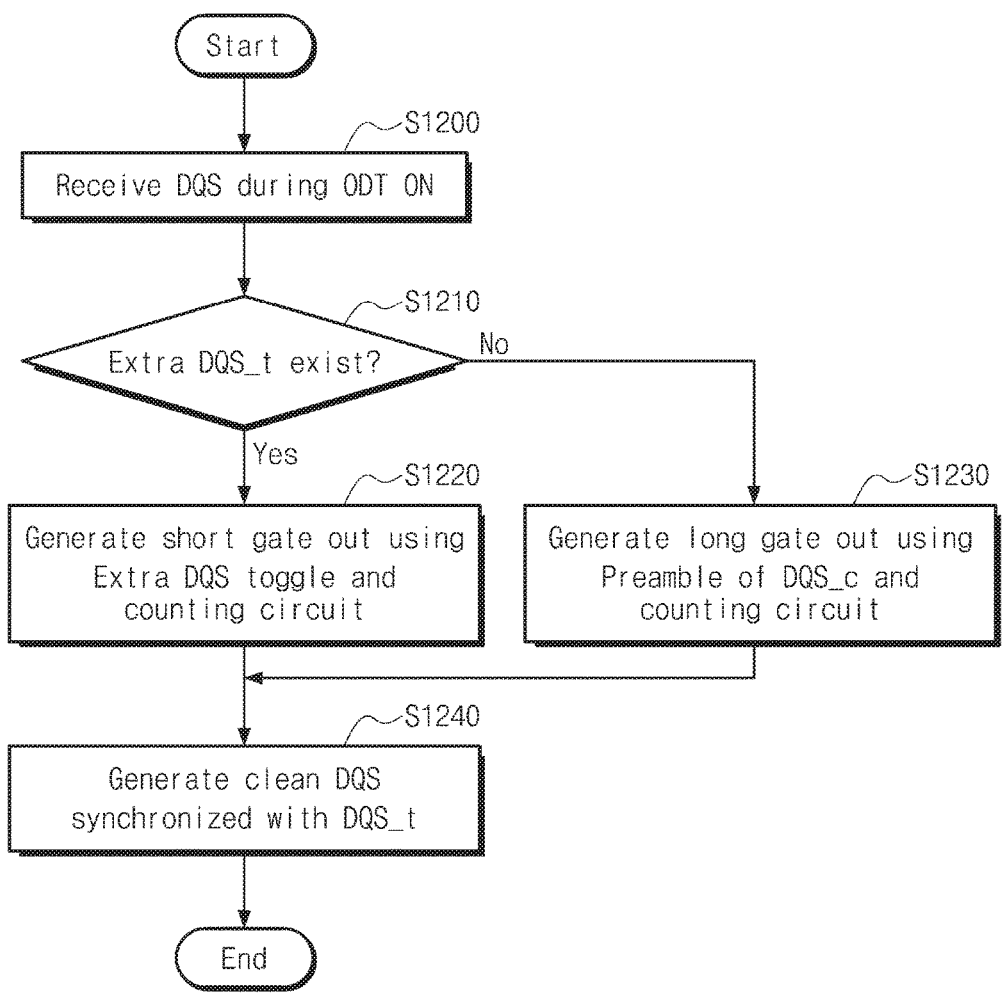
FIG. 12 is a detailed flowchart illustrating generation of a clean data strobe signal according to at least one example embodiment of the inventive concepts.

FIG. 12 is a detailed flowchart illustrating generation of a clean data strobe signal according to at least one example embodiment of the inventive concepts.

Referring to FIG. 12, when the ground VSSQ termination type of ODT control is in an ON-state, a first input data strobe signal DQS-t may be received to a first receiver 151 in operation S1200.

In operation S1210, it may be checked whether or not extra toggling exists in the first input data strobe signal DQS_t. When extra toggling exists, as described above in reference to FIG. 5, a data strobe gate signal D having a relatively short low pulse section (e.g., as a masking window) may be generated in operation S1220. Consequently, a short gate output may be generated using an extra DQS toggle and a counting circuit. On the other hand, when extra toggling does not exist, as described above with reference to FIG. 5, a data strobe gate signal D having a relatively long low pulse section may be generated in operation S1230.

Consequently, a long gate output may be generated using the preamble of DQS_c and a counting circuit.

In operation S1240, the signals C and D of FIG. 5 may be gated to generate a clean data strobe signal E synchronized with the first input data strobe signal DQS_t. Consequently, the gating unit that logic-gates the signals C and D of FIG. 5 may provide the clean data strobe signal as a clock used for receiving data according to at least one example embodiment.

Figure 13:
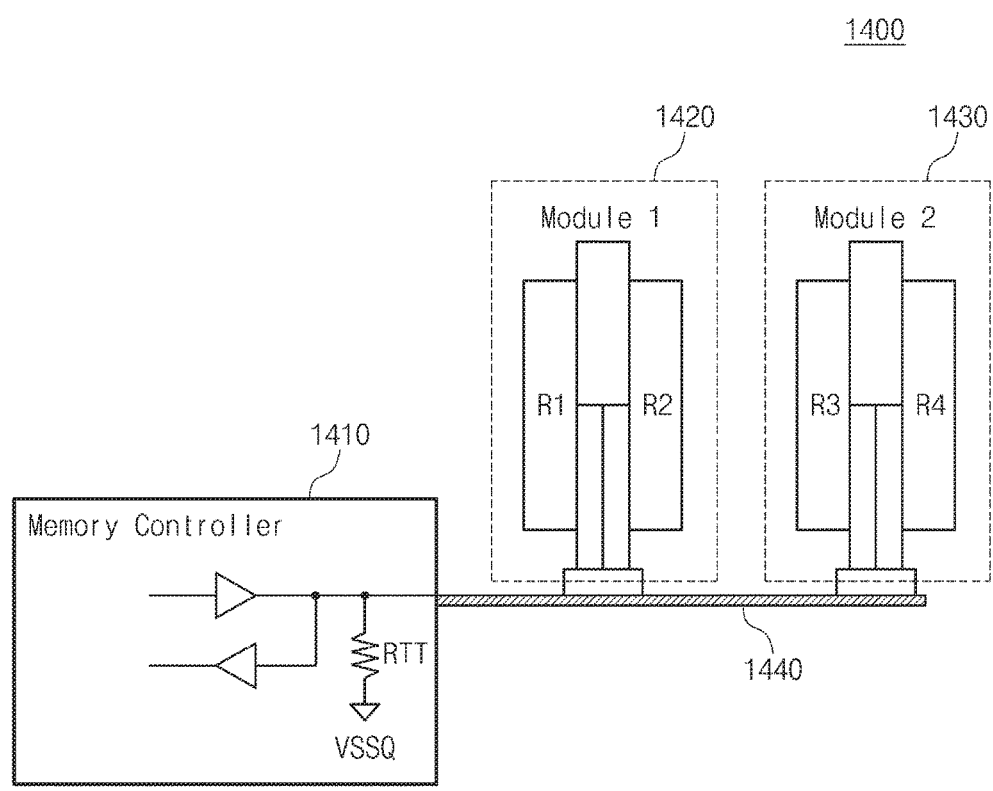
FIG. 13 is a block diagram illustrating a configuration of a memory system according to at least one example embodiment of the inventive concepts.

FIG. 13 is a block diagram illustrating a configuration of a memory system according to at least one example embodiment of the inventive concepts.

Referring to FIG. 13, a memory system 1400 may include a memory controller 1410, and at least one memory module 1420 and 1430, but is not limited thereto.

The memory controller 1410 may control the memory modules 1420 and 1430 so as to perform commands applied and/or transmitted from a processor, a host, etc. The memory controller 1410 may be implemented inside a processor, a host, and/or other processing device, and/or may be implemented with an application processor, a System on Chip (SoC), etc. For signal integrity, a source termination may be implemented on a bus 1440 of the memory controller 1410 through a resistor RTT. Although a VSSQ termination type of ODT is shown in the drawing, a VDD termination type of ODT control may also be performed.

In FIG. 13, the circuit of FIG. 2 may be included in the memory controller 1410 according to at least one example embodiment.

The first memory module 1420 and the second memory nodule 1430 may be connected to the memory controller 1410 through the bus 1440. The first memory module 1420 and the second memory module 1430 may include a plurality of semiconductor memory chips (e.g., semiconductor dies or devices) mounted onto a Printed Circuit Board (PCB), respectively, but is not limited thereto. For example, in the case of Dual In-line Memory Module (DIMM) type, the type of the memory module may be RDIMM, LRDIMM, FRDIMM, etc., but is not limited thereto. The semiconductor memory devices constituting the memory module may be divided into two or more ranks. That is, in the case of dual rank structure, a plurality of semiconductor memory devices mounted onto a board of the memory module may be classified into two ranks, and semiconductor memory devices pertaining to the same rank may be simultaneously accessed. Consequently, the rank may mean a unit by which the memory controller inputs and outputs data with respect to the semiconductor memory devices. Accordingly, when a single rank has a 64-bit data transmission width, a dual rank may have a data transmission width larger about 2 times than the single rank, and a quad rank may have a data transmission width larger four times than the single rank.

The first memory module 1420 may include at least one memory rank R1 and R2, and the second memory module 1430 may include at least one memory rank R3 and R4.

In at least one example embodiment of the inventive concepts, the memory ranks R1, R2, R3 and R4 may be connected by a multi-drop type in which data and/or address signals are transmitted and received through the same transmission line. The memory ranks R1, R2, R3 and R4 (i.e., the respective semiconductor memory devices included in each of the memory ranks) may be arranged in a plurality of rows, respectively and may be connected to at least one command/ address register by a fly-by ring topology, a daisy chain topology, etc. Also, the memory ranks R1, R2, R3 and R4 may be terminated to at least one module resistor unit which provides termination resistance of Rtt/2.

In FIG. 13, the memory system 1400 may generate a clean data strobe signal without performing a training operation, by the support of the circuit as shown in FIG. 2. Advantageously, a delay circuit and delay control circuit which are related to delay control of the data strobe signal may not be needed. Also, since a portion of data strobe signal of the asynchronization domain can be masked without a signal training operation, the time taken (or in other words, the time required) to generate the clean data strobe signal may be shortened. Accordingly, the operation performance of the memory system 1400 may be improved.

In FIG. 13, the semiconductor memory devices constituting the memory module have been illustrated as being implemented with volatile semiconductor memory devices (e.g., DRAM), but in other example embodiments, the volatile semiconductor memory devices may be replaced with non-volatile semiconductor memory devices (e.g., MRAM, etc.). Volatile semiconductor memory devices such as SRAM or DRAM may lose stored data when power supply is cut off. On the contrary, non-volatile semiconductor memory devices, such as Magnetic Random Access Memory (MRAM), may maintain stored data even though power supply is cut off. Accordingly, in order to prevent data being lost by power supply failure or interruption, non-volatile semiconductor memory devices may be used to store data. Additionally, when Spin Transfer Torque Magneto resistive Random Access Memory (STT-MRAM) constitutes the memory, the advantages of MRAM may be added in addition to the advantages of DRAM.

Figure 14:
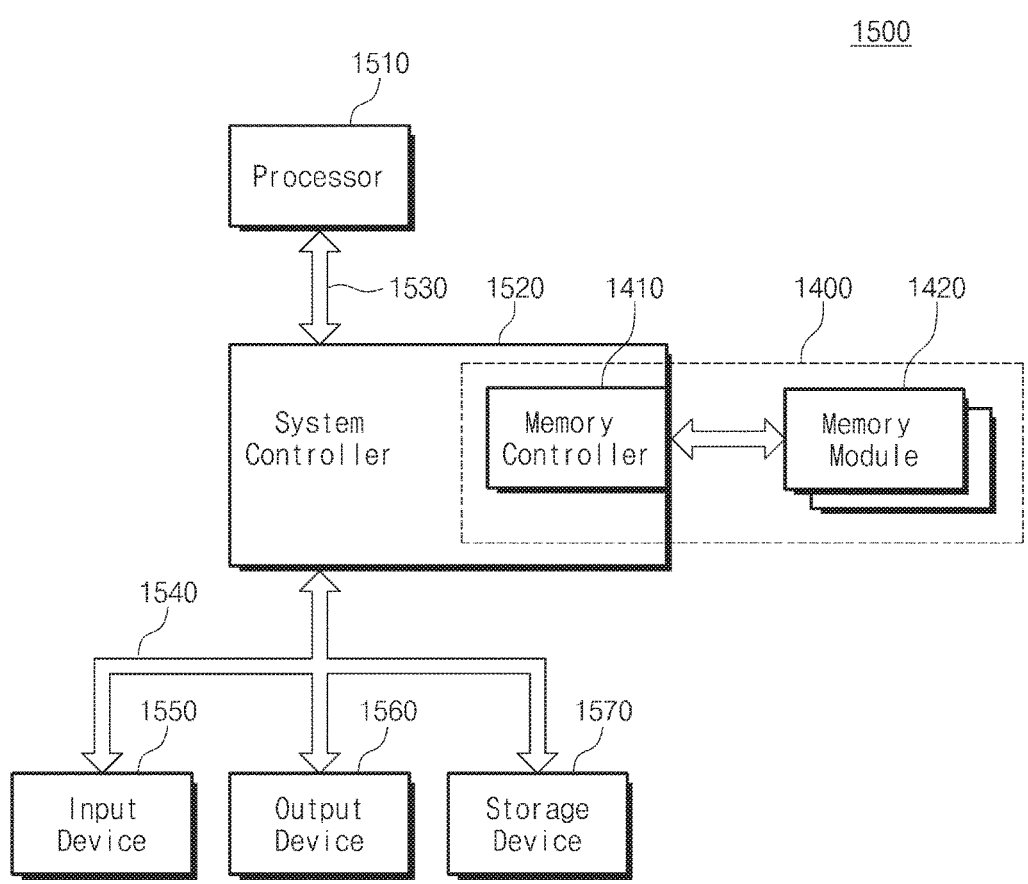
FIG. 14 is a block diagram illustrating an application example applied to a computing system according to at least one example embodiment of the inventive concepts.

FIG. 14 is a block diagram illustrating an application example applied to a computing system according to at least one example embodiment.

Referring to FIG. 14, a computing system 1500 may include a processor 1510, a system controller 1520, and a memory system 1400.

The computing system 1500 may further include a processor bus 1530, an expansion bus 1540, an input device 1550, an output device 1560, and a storage device 1570. The memory system 1400 may include at least one memory module 1420 and a memory controller for controlling the memory module 1420. The memory controller 1410 may be included in the system controller 1520.

The processor 1510 may execute various computing functions like execution of specific software which executes specific calculations or tasks. For example, the processor 1510 may be a microprocessor, a Central Processing Unit (CPU), etc. The processor 1510 may be connected to the system controller 1520 through the processor bus 1530 including an address bus, a control bus, and/or a data bus.

The host interface between the processor 1510 and the system controller 1520 may include various protocols for performing data exchange. For example, the system controller 1520 may be configured to communicate with a host or an external device through at least one of various protocols such as Universal Serial Bus (USB) protocol, MMC (multimedia card) protocol, peripheral component interconnection (PCI) protocol, PCI-Express (PCI-E) protocol, Advanced Technology Attachment (ATA) protocol, Serial-ATA protocol, Parallel-ATA protocol, Small Computer Small Interface (SCSI) protocol, Enhanced Small Disk Interface (ESDI) protocol, Integrated Drive Electronics (IDE) protocol, etc.

The system controller 1520 may be connected to the expansion bus 1540 such as a Peripheral Component Interconnect (PCI) bus. Thus, the processor 1510 may control at least one input device 1550 such as a keyboard or a mouse, at least one output device 1560 such as a printer or a display unit, or at least one storage unit 1570 such as a hard disk drive, a solid state drive, or a CD-ROM through the system controller 1520.

The circuit of FIG. 2 may be disposed between the memory controller 1410 and the memory module 1420, and thus the signal training process for synchronizing with the data strobe signal may be omitted.

Examples of the display device that is one of the output devices 1560 may include Thin Film Transistor Liquid Crystal Display (TFT-LCD), Light-Emitting Diode (LED) display, Organic LED (OLED) display, Active-Matrix OLED (AMOLED) display, or flexible display.

The memory controller 1410 may control the memory module 1520 so as to perform commands provided by the processor 1510. The memory module 1420 may store data provided from the memory controller 1410 and may provide the stored data for the memory controller 1410.

The memory module 1420 may include a plurality of semiconductor memory devices, for example, volatile memories including dynamic random access memory (DRAM) and static random access memory (SRAM) and non-volatile memories.

Examples of the volatile memories may include dynamic random access memory (DRAM), static random access memory (SRAM), thyristor RAM, (TRAM), Zero capacitor RAM (Z-RAM), Twin Transistor RAM (TTRAM), etc.

Examples of the non-volatile memories may include Electrically Erasable Programmable Read-Only Memory (EEPROM), flash memory, Magnetic RAM (MRAM), Spin-Transfer Torque MRAM, Conductive Bridging RAM (CBRAM), Ferroelectric RAM (FeRAM), Phase change RAM (PRAM), Resistive RAM (RRAM), Nanotube RRAM, Polymer RAM (PoRAM), Nano Floating Gate Memory (NFGM), holographic memory, Molecular Electronics Memory Device, Insulator Resistance Change Memory, etc. One or more bits may be stored in a unit cell of the non-volatile memory.

The computing system may be modified or extended to one of various components of electronic devices such as Ultra Mobile PC (UMPC), workstation, net-book, Personal Digital Assistant (PDA), portable computer, web tablet, tablet computer, wireless phone, mobile phone, smart phone, e-book, Portable Multimedia Player (PMP), portable game console, navigation device, black box, digital camera, Digital Multimedia Broadcasting (DMB) player, three-dimensional television, digital audio recorder, digital audio player, digital picture recorder, digital picture player, digital video recorder, digital video player, storage constituting data center, devices that transmit and receive information under wireless environment, one of various electronic devices constituting home network, one of various electronic devices constituting computer network, one of various electronic devices constituting telematics network, RFID device, or one of various components constituting computing system.

According to the configuration of at least one of the example embodiments of the inventive concepts, because a clean data strobe signal may be generated without performing a gate training operation, a delay circuit and a delay control circuit which are related to delay of a memory gate signal may be advantageously removed.

Also, since a portion of data strobe signal of asynchronization domain may be masked without a gate training operation, the time taken and/or required to generate the clean data strobe signal may be shortened.

The units and/or modules described herein may be implemented using hardware components, software components, or a combination thereof. For example, the hardware components may include microcontrollers, memory modules, sensors, amplifiers, band-pass filters, analog to digital converters, and processing devices, or the like. A processing device may be implemented using one or more hardware device configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such as parallel processors, multi-core processors, distributed processing, or the like.

The software may include a computer program, a piece of code, an instruction, or some combination thereof, to independently or collectively instruct and/or configure the processing device to operate as desired, thereby transforming the processing device into a special purpose processor. Software and data may be embodied permanently or temporarily in any type of machine, component, physical or virtual equipment, or computer storage medium or device. The software also may be distributed over network coupled computer systems so that the software is stored and executed in a distributed fashion. The software and data may be stored by one or more non-transitory computer readable recording mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of some example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A clean data strobe signal generating circuit, comprising:
   a first receiver configured to receive a differential data strobe signal comprising at least a first input data strobe signal and a second input data strobe signal, and output a first single ended data strobe signal;
   a second receiver configured to receive the second input data strobe signal and a reference voltage signal, and based on the received second input data strobe signal and the reference voltage signal, output a second single ended data strobe signal;
   a gate signal generator configured to generate a data strobe gate signal synchronized with the first single ended data strobe signal based on the first and second single ended data strobe signals and a memory gate signal, the memory gate signal including a pulse width that varies in accordance with a burst length after termination of a read latency, wherein a pulse window of the data strobe gate signal becomes narrower when extra preamble toggling exists in the first single ended data strobe signal; and
   at least one logic gate configured to receive the first single ended data strobe signal and the data strobe gate signal to generate a clean data strobe signal for receiving read data.

2. The clean data strobe signal generating circuit of claim 1, wherein the differential data strobe signal is transmitted from a semiconductor memory device.

3. The clean data strobe signal generating circuit of claim 1, wherein the phase of the second single ended data strobe signal is opposite to the phase of the first single ended data strobe signal except in an unknown section of the first single ended data strobe signal.

4. The clean data strobe signal generating circuit of claim 1, wherein
   the data strobe gate signal transitions to a first level in response to a signal synchronized with the second single ended data strobe signal;
   the number of toggles of the first single ended data strobe signal is counted in response to a count start signal synchronized with a first falling edge of the first single ended data strobe signal; and
   the data strobe gate signal transitions to a second level in response to a reset signal generated after the counting of the number of toggles.

5. The clean data strobe signal generating circuit of claim 1, wherein when the first single ended data strobe signal is inverted by an inverter, the at least one logic gate is a NOR gate that is configured to generate a NOR response.

6. The clean data strobe signal generating circuit of claim 1, wherein when the phase of the first single ended data strobe signal is opposite to the phase of the first input data strobe signal, the at least one logic gate is an AND gate that is configured to generate an AND response.

7. The clean data strobe signal generating circuit of claim 1, wherein the differential data strobe signal is applied from a Low Power Double Data Rate 4 (LPDDR4) Dynamic Random Access Memory (DRAM) device configured to perform a ground voltage termination type of on-die termination operation.

8. The clean data strobe signal generating circuit of claim 1, wherein the clean data strobe signal is provided as a data clock signal of a First-In First-Out (FIFO) memory configured to receive the read data.

9. The clean data strobe signal generating circuit of claim 1, wherein the pulse width of the memory gate signal is half of a width of the burst length.

10. A clean data strobe signal generating circuit, comprising:
a first receiver configured to receive a differential data strobe signal comprising first and second input data strobe signals, and output a first single ended data strobe signal;
a second receiver configured to receive the second input data strobe signal and a reference signal, and based on the received second input data strobe signal and the reference signal, output a second single ended data strobe signal;
a memory gate signal generator configured to generate a memory gate signal having a pulse width to which a burst length is applied after termination of a read latency;
a gate signal generator configured to receive the first and second single ended data strobe signals and the memory gate signal, and generate a data strobe gate signal by counting a number of toggles of the first single ended data strobe signal based on the memory gate signal, wherein a pulse window of the data strobe gate signal becomes wider when extra preamble toggling does not exist in the second single ended data strobe signal; and
at least one logic gate configured to receive the first single ended data strobe signal and the data strobe gate signal, and generate a clean data strobe signal for receiving read data, as a gating response.

11. The clean data strobe signal generating circuit of claim 10, wherein the differential data strobe signal is transmitted from a Dynamic Random Access Memory (DRAM).

12. The clean data strobe signal generating circuit of claim 11, wherein the DRAM is a Registered Dual In-line Memory Module (RDIMM) or a Load-Reduced Dual In-line Memory Module (LRDIMM).

13. The clean data strobe signal generating circuit of claim 10, wherein the counting of the number of toggles of the first single ended data strobe signal is performed by a counter or a shift register.

14. A read interface circuit comprising:
an input buffer configured to receive data from at least one memory device;
a data receiving memory configured to store the received data transmitted from the input buffer in accordance with a data clock signal; and
a clean data strobe signal generating circuit configured to receive a differential data strobe signal from the at least one memory device, and generate a clean data strobe signal, the clean data strobe signal used as the data clock signal, the clean data strobe generating circuit including,
a gate signal generator configured to generate a data strobe gate signal synchronized with the differential data strobe signal, a reference voltage signal, and a memory gate signal, the memory gate signal including a pulse width that varies in accordance with a burst length after termination of a read latency, wherein a pulse window of the data strobe gate signal becomes narrower when extra preamble toggling exists in the first single ended data strobe signal.

15. The read interface circuit of claim 14, wherein
the clean data strobe signal generating circuit includes a first receiver, and a second receiver;
the received differential data strobe signal includes a first input data strobe signal and a second input data strobe signal;
the first receiver is configured to receive the first input data strobe signal and the second input data strobe signal and output a first single ended data strobe signal;
the second receiver is configured to receive the second input data strobe signal and the reference voltage signal and output a second single ended data strobe signal;
the gate signal generator is further configured to receive the first and second single ended data strobe signals and generate the data strobe gate signal based on the received first and second single ended data strobe signals; and
the clean data strobe signal generating circuit is further configured to generate the clean data strobe signal based on the data strobe gate signal and the first single ended data strobe signal.

16. The read interface circuit of claim 14, wherein the at least one memory device is a volatile semiconductor device.

17. The read interface circuit of claim 14, wherein the at least one memory device is a non-volatile semiconductor memory device.

18. The read interface circuit of claim 14, wherein the data receiving memory is further configured to output the stored read data to a memory controller.

* * * * *